United States Patent [19]

Kimura et al.

[11] Patent Number: 4,788,698
[45] Date of Patent: Nov. 29, 1988

[54] X-RAY EXPOSURE SYSTEM

[75] Inventors: Takeshi Kimura, Higashimurayama; Kozo Mochiji, Hachioji; Shojiro Asai, Kanagawa, all of Japan; Hidehito Obayashi, Burlingame, Calif.

[73] Assignee: Hitachi, Ltd., Tokyo, Japan

[21] Appl. No.: 28,024

[22] Filed: Mar. 17, 1987

Related U.S. Application Data

[63] Continuation of Ser. No. 723,136, Apr. 15, 1984, abandoned.

[51] Int. Cl.$^4$ .............................................. G21K 5/00
[52] U.S. Cl. ........................................ 378/34; 378/84; 378/145
[58] Field of Search ................... 378/34, 145, 146, 84, 378/85, 119; 250/396 R, 399; 328/233, 235

[56] References Cited

U.S. PATENT DOCUMENTS

| | | | |
|---|---|---|---|
| 4,028,547 | 6/1977 | Eisenberger | 378/34 |
| 4,242,588 | 12/1980 | Silk et al. | 378/34 |
| 4,514,857 | 4/1985 | Kumura et al. | 378/34 |

FOREIGN PATENT DOCUMENTS 3330806 3/1985 Fed. Rep. of Germany ........ 378/34

OTHER PUBLICATIONS

Bannenberg et al., "A 40–200 kV Ion Accelerator with Three Beam Lines", Nud. Instr. and Methods, 91 (2), 1971 pp. 269–276, 328/233.

E. Spiller et al., "Application of Synchrotron to X-ray Lithography", Journal of Applied Physics, vol. 47, No. 12, Dec. '76 378/34.

Primary Examiner—Carolyn E. Fields
Assistant Examiner—David P. Porta
Attorney, Agent, or Firm—Antonelli, Terry & Wands

[57] ABSTRACT

An X-ray exposure system including a plurality of X-ray exposure apparatuses each for duplicating a mask pattern on a semiconductor wafer by irradiating an X-ray mask and the semiconductor wafer with synchrotron radiation is disclosed in which a synchrotron radiation path branching device including a reflecting mirror is disposed between a synchrotron ring and the X-ray exposure apparatuses, and the propagation direction of the synchrotron radiation emitted from the synchrotron ring is changed by the reflecting mirror so that the synchrotron radiation from the ring can be introduced into each of the X-ray exposure apparatuses.

14 Claims, 2 Drawing Sheets

X-RAY EXPOSURE SYSTEM

This application is a continuation of application Ser. No. 723,136, filed Apr. 15, 1984, now abandoned.

BACKGROUND OF THE INVENTION

The present invention relates to the arrangement of an X-ray exposure system for forming the duplicate of a fine mask pattern on a semiconductor substrate through the soft X-ray lithography using synchrotron radiation.

X-ray exposure apparatuses for carrying out X-ray duplication by synchrotron radiation (hereinafter simply referred to as "SR") have hitherto been arranged as shown in FIG. 1. That is, the SR emitted from a synchrotron (storage) ring 1 is taken out through a plurality of beam ducts 2, and an exposure apparatus 3 is provided at the end of each beam duct 2. Such an arrangement has been reported e.g. by R. P. Haelbich et al. (members of IBM), at the 3rd national conference on synchrotron radiation instrumentation held on Sept. 12 through 15, 1983.

In the arrangement of FIG. 1, the exposure stations 3 are located around the synchrotron ring 1 separatedly, and therefore a plurality of facilities and man powers are required to operate the respective exposure stations. Moreover, such an arrangement is inconvenient for utilizing the exposure stations 3.

Generally speaking, in the case where a circuit pattern is formed on a silicon wafer by an X-ray exposure apparatus, time required for loading and unloading the silicon wafers in the X-ray exposre apparatus and time required for aligning an X-ray mask with the silicon wafer are far longer than time required for irradiating the X-ray mask and silicon wafer with SR. Further, the SR is emitted continuously from the synchrotron ring 1. Accordingly, in the arrangement of FIG. 1, the SR passes through a beam duct 2 wastefully over a long period other than an exposure time, and thus each exposure stations 3 is considered to be low in utilization efficiency of SR.

Further, it is needless to say that the arrangement shown in FIG. 1 is inconvenient for utilizing the exposure stations 3, as compared with the case where the exposure stations 3 are concentrated in a place.

SUMMARY OF THE INVENTION

It is accordingly an object of the present invention to provide an X-ray exposure system which can eliminate the drawbacks of the prior art and is high in utilization efficiency of SR.

In order to attain the above object, according to the present invention, there is provided an X-ray exposure system, in which, as shown in FIG. 2, a beam duct 2 for transmitting SR is divided at a branch part 4 into a plurality of sub-ducts 21 to 23, and X-ray exposure apparatuses 31 to 33 provided at the ends of the sub-ducts 21 to 23 are selectively and time-divisionally supplied with the SR by branching section 4 to introduce the SR into an X-ray exposure apparatus which has completed the preparation for exposure.

The present invention will be more apparent from the following detailed explanation taken in conjunction with the accompanying drawings.

DESCRIPTION OF THE PREFERRED EMBODIMENTS

Figure 1:
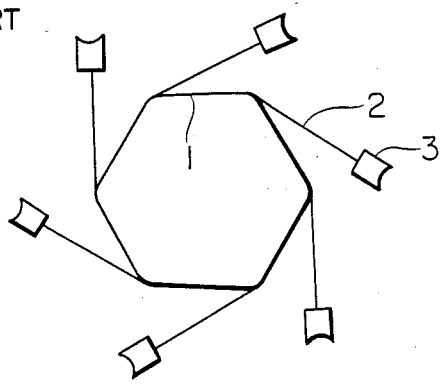
FIG. 1 is a schematic diagram showing the conventional arrangement of X-ray exposure apparatuses which use SR.
Figure 2:
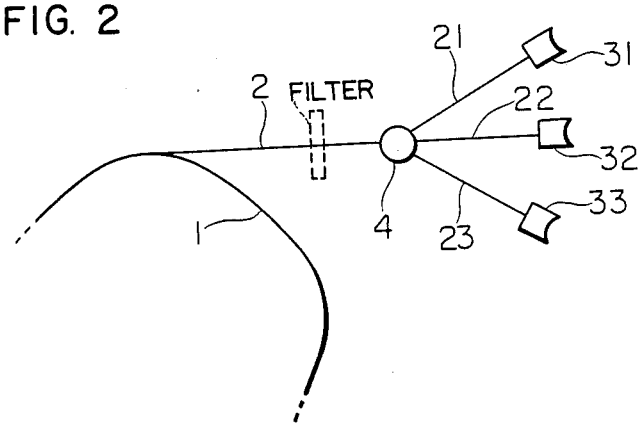
FIG. 2 is a schematic diagram for explaining an embodiment of an X-ray exposure system according to the present invention.
Figure 3:
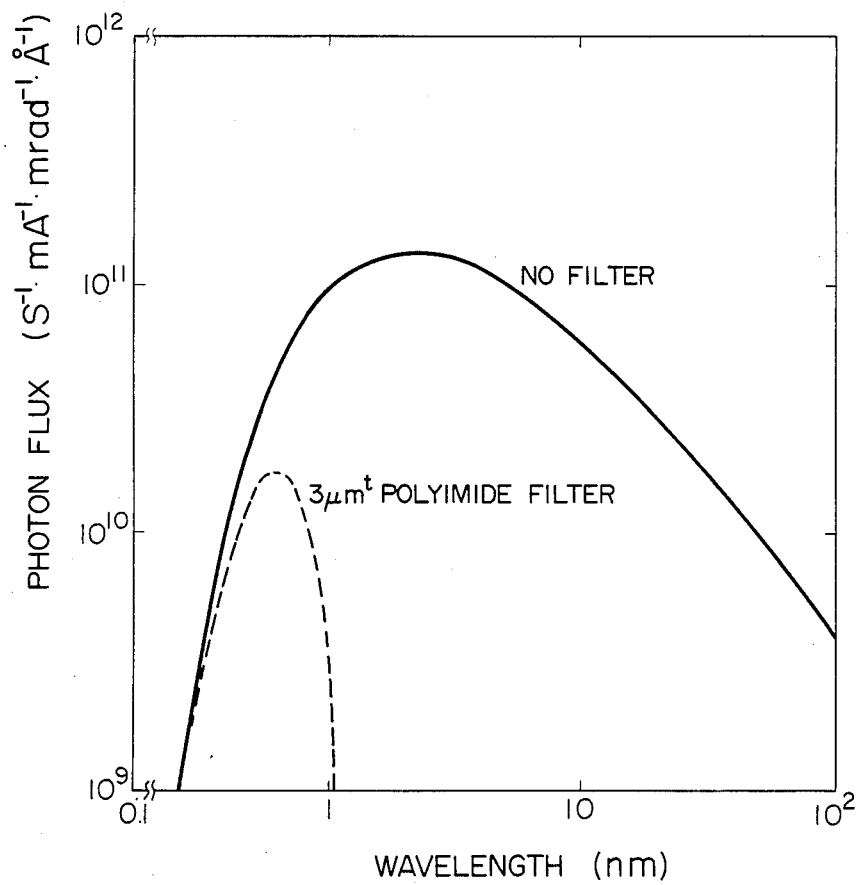
FIG. 3 is a graph showing spectra of SR.

Referring to FIG. 2 which shows an embodiment of an X-ray exposure system according to the present invention, the SR having passed through the beam duct 2 can travel in three directions with the aid of the branch part 4, that is, can reach the X-ray exposure apparatuses 31, 32 and 33 through the sub-ducts 21, 22 and 23, respectively. Now, let us consider the case where the synchrotron ring 1 is operated under conditions that the electron acceleration energy is equal to $1 \times 10^9$ eV, the magnetic field intensity for deflecting an electron beam is equal to 1.1 T, and the average value of storage current is equal to 100 mA. Then, the SR emitted from the synchrotron ring 1 has a spectrum such as indicated by a solid line in FIG. 3. That is, a maximum number of photons are generated at a wavelength of about 15 Å (namely, 1.5 nm). Incidentally, a broken line shown in FIG. 3 indicates the spectrum of the SR having passed through a long-wavelength cutoff filter or short-wavelength pass filter which is made of polyimide resin and has a thickness of 3 $\mu$m, and the SR in the wavelength range indicated by the broken line can be used for the X-ray pattern duplication.

Figure 4:
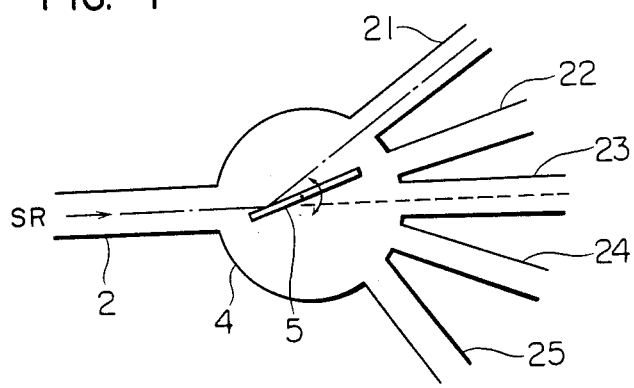

FIG. 4 shows an example of the branching unit 4, in which a reflecting mirror has a high reflectivity for SR so that the above SR can travel in five directions. Referring to FIG. 4, a reflecting mirror 5 is a rotatable plane mirror, both principal surfaces of which are coated with gold. The rotating axis of the mirror 5 is deviated from the optical path of an SR beam emerging from a beam duct 2. An angle between the reflecting mirror 5 and the optical path of the SR beam emerging from the beam duct 2 is changed by control means (not shown) so that the SR beam can pass through each of sub-ducts 21 to 25. In more detail, the SR beam having passed through the beam duct 2 is introduced into the sub-duct 23, without being reflected by the mirror 5. While, the SR beam reflected from the mirror 5 is introduced into one of the sub-ducts 21, 22, 24 and 25.

As mentioned previously, the rotating axis of the reflecting mirror 5 is deviated from the optical path of the SR beam emerging from the beam duct 2. Accordingly, the effective area for reflecting SR varies with the selection of the reflection angle, i.e. selection of the sub-ducts 21 to 25. Thus, the radiation damage to the reflecting mirror 5 is mitigated, and hence the life thereof is greatly increased.

Figure 5:
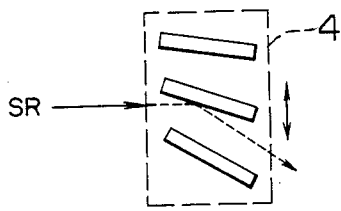
FIGS. 4 and 5 are schematic diagrams showing examples of the branching section 4 of FIG. 2.

In the present embodiment, the propagation direction of SR is changed by rotating the reflecting mirror 5 included in the branching unit 4. Alternatively, as shown in FIG. 5, fixed-angle reflection mirrors, one for each branched optical path, may be used in place of a rotating mirror. In this case, one mirror for a desired sub-duct is inserted in the optical path of the SR beam and other mirrors designated for other sub-ducts are displaced from the optical path, according to necessity. Needless to say, such a branching unit can produce similar effects as the branching unit 4 of the present embodiment. As an alternative of the X-ray exposure apparatus 31–33 shown in FIG. 2 an SR utilization apparatus, such as a thin-film vapor growth apparatus or a dry etching apparatus may be located.

In the present embodiment, the SR beam from the beam duct 2 is introduced into three sub-ducts 21 to 23 or five sub-ducts 21 to 25. However, the present invention is not limited to such a case, but the SR beam from the beam duct 2 can be introduced into a desired number of sub-ducts.

As is evident from the foregoing explanation, according to the present invention, the utilization efficiency of SR and the practicability of X-ray exposure apparatus are greatly improved. Thus, the present invention is very effective for putting X-ray lithography to practical use.

We claim:

1. An X-ray exposure system for receiving a single beam of synchrotron radiation (SR) from an SR source comprising a plurality of X-ray exposure apparatuses each for duplicating a mask pattern on a radiation sensitive material disposed for receiving said single beam of SR from said SR source through an X-ray mask, and SR path changing means being disposed between the SR source and the X-ray exposure apparatuses for selectively changing the propagation direction of the single beam of SR emitted from said SR source for selectively introducing an entirety of said single beam of SR into a different one of said X-ray exposure apparatuses, respectively.

2. An X-ray exposure system according to claim 1, wherein said SR path changing means includes at least one reflecting mirror for selectively changing the propagation direction of the single beam of SR emitted from said SR source.

3. An X-ray exposure system according to claim 1, wherein the single beam of SR emitted from said SR source is directed by said SR path changing means to the X-ray exposure appartuses in a time divisional fashion so that said single beam of SR is introduced into an X-ray exposure apparatus having completed the alignment between the X-ray mask and the radiation sensitive material.

4. An X-ray system for receiving a single beam of synchrotron radiation (SR) from and SR source, comprising and X-ray exposure apparatus for duplicating a mask pattern on a radiation sensitive material disposed for receiving said single beam of SR from said SR source through an X-ray mask, and at least one utilization apparatus disposed for receiving and utilizing said single beam of SR from said SR source, and SR path changing means being disposed between the SR source and the X-ray exposure apparatus and the utilization apparatus for selectively changing the propagation direction of the single beam of SR emitted from said SR source for selectively introducing said SR into one of said X-ray exposure apparatus and said utilization apparatus.

5. An X-ray exposure system according to claim 2, wherein said at least one reflecting mirror is rotatable, and the rotating axis of said at least one reflecting mirror is deviated from the propagation direction of the single beam of SR incident upon said at least one reflecting mirror.

6. An X-ray exposure system according to claim 1, wherein said SR path changing means includes a plurality of reflecting mirrors for directing the single beam of SR emitted from said SR source, to said X-ray exposure apparatuses, a selected one of said reflecting mirrors being inserted on the optical path of said single beam of SR into a selected one of said X-ray exposure apparatuses.

7. An X-ray system according to claim 4, wherein said utilization apparatus includes a thin film vapor growth apparatus.

8. An X-ray system according to claim 4, wherein said utilization apparatus includes a dry etching apparatus.

9. An X-ray exposure system for utilizing one synchrotron radiation (SR) beam, comprising:
   means for emitting one SR beam along a propagation path;
   a plurality of X-ray utilization devices arranged for receiving and utilizing the one SR beam therein; and
   means disposed along the propagation path of the SR beam for selectively changing the propagation direction of the one SR beam to enable application of the one SR beam to one of said utilization devices.

10. An X-ray exposure system according to claim 9, wherein said X-ray utilization devices include X-ray exposure units, each exposure unit being arranged for exposing a radiation sensitive member with the SR beam.

11. An X-ray exposure system according to claim 9, wherein said changing means includes at least one movable mirror arranged for positioning with respect to the propagation path of the one SR beam.

12. An X-ray exposure system according to claim 11, wherein said at least one movable mirror is arranged for positioning across the propagation path of the one SR beam.

13. An X-ray exposure system according to claim 12, wherein said at least one movable mirror is a rotatable mirror rotatable about a rotation axis.

14. An X-ray exposure system according to claim 13, wherein said rotatable mirror has said rotation axis deviated from the propagation path of the one SR beam.

* * * * *